US006624426B2

(12) United States Patent
Rubin

(10) Patent No.: US 6,624,426 B2
(45) Date of Patent: Sep. 23, 2003

(54) SPLIT MAGNETIC LENS FOR CONTROLLING A CHARGED PARTICLE BEAM

(75) Inventor: Allan I. Rubin, Concord, MA (US)

(73) Assignee: Schlumberger Technologies Inc., San Jose, CA (US)

( * ) Notice: Subject to any disclaimer, the term of this patent is extended or adjusted under 35 U.S.C. 154(b) by 181 days.

(21) Appl. No.: 09/734,409

(22) Filed: Dec. 11, 2000

(65) Prior Publication Data

US 2002/0070346 A1 Jun. 13, 2002

(51) Int. Cl.$^7$ ................................................ H01J 37/14
(52) U.S. Cl. ............................................... 250/396 ML
(58) Field of Search ..................... 250/396 R, 396 ML

(56) References Cited

U.S. PATENT DOCUMENTS 2,418,349 A * 4/1947 Hillier et al.
2,438,971 A   4/1948 Hillier
3,851,172 A * 11/1974 Ozasa et al. ......... 250/396 ML
4,585,942 A *  4/1986 Tsuno .................. 250/396 ML
5,264,706 A * 11/1993 Oae et al. ............ 250/396 ML
5,442,182 A *  8/1995 Kubo et al. .......... 250/396 ML
5,506,482 A *  4/1996 Teramatsu et al. .......... 315/382

FOREIGN PATENT DOCUMENTS

EP      0 045 844   *  2/1982
EP      0 596 529      11/1993
JP      59171442       9/1984

* cited by examiner

*Primary Examiner*—Bruce Anderson
(74) *Attorney, Agent, or Firm*—Cohen, Pontani, Lieberman & Pavane

(57) ABSTRACT

A magnetic lens focuses a charged particle beam generated by an instrument to a very small spot for deriving characteristics of a sample. The magnetic flux pattern is created by splitting the winding coil into a primary coil and a secondary coil. This enables faster adjustment of the magnetic flux, and with improved resolution.

7 Claims, 5 Drawing Sheets

SPLIT MAGNETIC LENS FOR CONTROLLING A CHARGED PARTICLE BEAM

FIELD OF THE INVENTION

The invention is directed to a magnetic lens for controlling a charged particle beam, such as one directed by an instrument toward a very small spot on a sample for deriving characteristics of that sample and, in particular, to a winding coil arrangement that provides a faster adjustment of the magnetic flux and with improved resolution.

BACKGROUND OF THE INVENTION

Various instruments are known that utilize a magnetic lens for controlling a charged particle beam directed toward a sample and which rely on interaction of charged particles emitted from that sample to derive characteristics thereof. Examples of such instruments are an electron microscope and a focused ion beam microscope. Other machines can also utilize a magnetic lens to direct a charged particle beam toward a sample, such as a lithography machine.

For facilitating the description of the present invention, it will be explained in connection with a scanning electron microscope ("SEM"). However, it should be understood that the invention is not limited to an SEM and can be applied by one with ordinary skill in the art to other instruments and machines that require a focused beam of charged particles.

An SEM operates by generating a primary scanning electron beam that impacts a sample, a surface of which is being imaged. As a result, backscattered and secondary electrons are emitted from the sample surface and collected by a detector which is arranged near the surface of the sample. The detector generates a signal from the electron emission collected from the sample surface as it is exposed to the electron beam. The signal from the detector is used as an input to various well known electronic components to output signals used for displaying an image of the surface on a video screen.

A typical arrangement of the main components of an SEM is schematically shown in FIG. 1. Electron source 2 generates an electron beam 3 which is directed through aligned openings at opposite ends of tube 4 toward sample 5. Detector 6 collects electrons emitted from sample 5. Beam 3 passes through opening 8 in detector 6. Beam 3 is controlled by stigmation coils 7, alignment coils 9, scan coils 11a and 11b, and lens 13. The function of these components is well known. Briefly, stigmation coils 7 are used to correct the shape of the beam. Alignment coils 9 are used to align the beam through the tube 4. Scan coils 11a and 11b deflect electron beam 3 in two directions, respectively, such as along an x-direction and a y-direction in a plane perpendicular to the beam direction. SEM's can contain more than one of any of these components, as well as other components that are not described herein. Also, the positions of the various components need not be as shown in FIG. 1 which is presented for illustrative purposes rather than accuracy.

Lens 13 is an electromagnetic lens which is provided for focusing of the beam 3 to a very small spot to enable high resolution imaging. Such a lens is commonly called an objective lens. In the illustrative representation of objective lens 13 in FIG. 1, it includes a toroidal, channel-shaped magnetic polepiece 14 with a lens inner pole 15 and a lens outer pole 17, and a winding 19 inside the channel.

FIG. 2 shows a cross sectional view of a specific type of objective lens 30. The detailed description of the present invention which follows below will be with respect to this type of lens 30, although it will be understood that in no way does such description limit the invention to use on only that lens.

Briefly, lens 30 has a toroidal, channel-shaped magnetic pole 40. Pole 40 has an inner yoke 42, an outer yoke 44, and a winding 46 inside the channel. The inner and outer yokes 42 and 44 are provided with poles 50 and 60 that project toward sample 5 and serve to create a magnetic flux pattern which focuses beam 3 to a very small spot as it impacts the sample.

Although objective lens 30 is effective for focusing the electron beam 3, when an adjustment of the magnetic flux is required to conduct calibration and various other lens operations, its time constant is too long for certain purposes. Also, when a relatively small adjustment is required, its adjustment resolution may not be sufficient.

SUMMARY OF THE INVENTION

One object of the invention is to provide a winding coil arrangement for a magnetic lens that enables a faster adjustment of the magnetic flux.

Another object of the invention is to provide a winding coil arrangement that provides adjustment of the magnetic flux with improved resolution.

These and other objects are attained in accordance with one aspect of the present invention directed to a winding coil for a magnetic lens which controls a charged particle beam. The winding coil includes a bobbin arrangement, a primary winding wound on the bobbin arrangement and having a selected number of ampere-turns, and a secondary winding wound on the bobbin arrangement and having a selected number of ampere-turns. The number of ampere-turns of the secondary winding is substantially smaller than the number of ampere-turns of the primary winding.

DETAILED DESCRIPTION OF THE DRAWINGS

Figure 1:
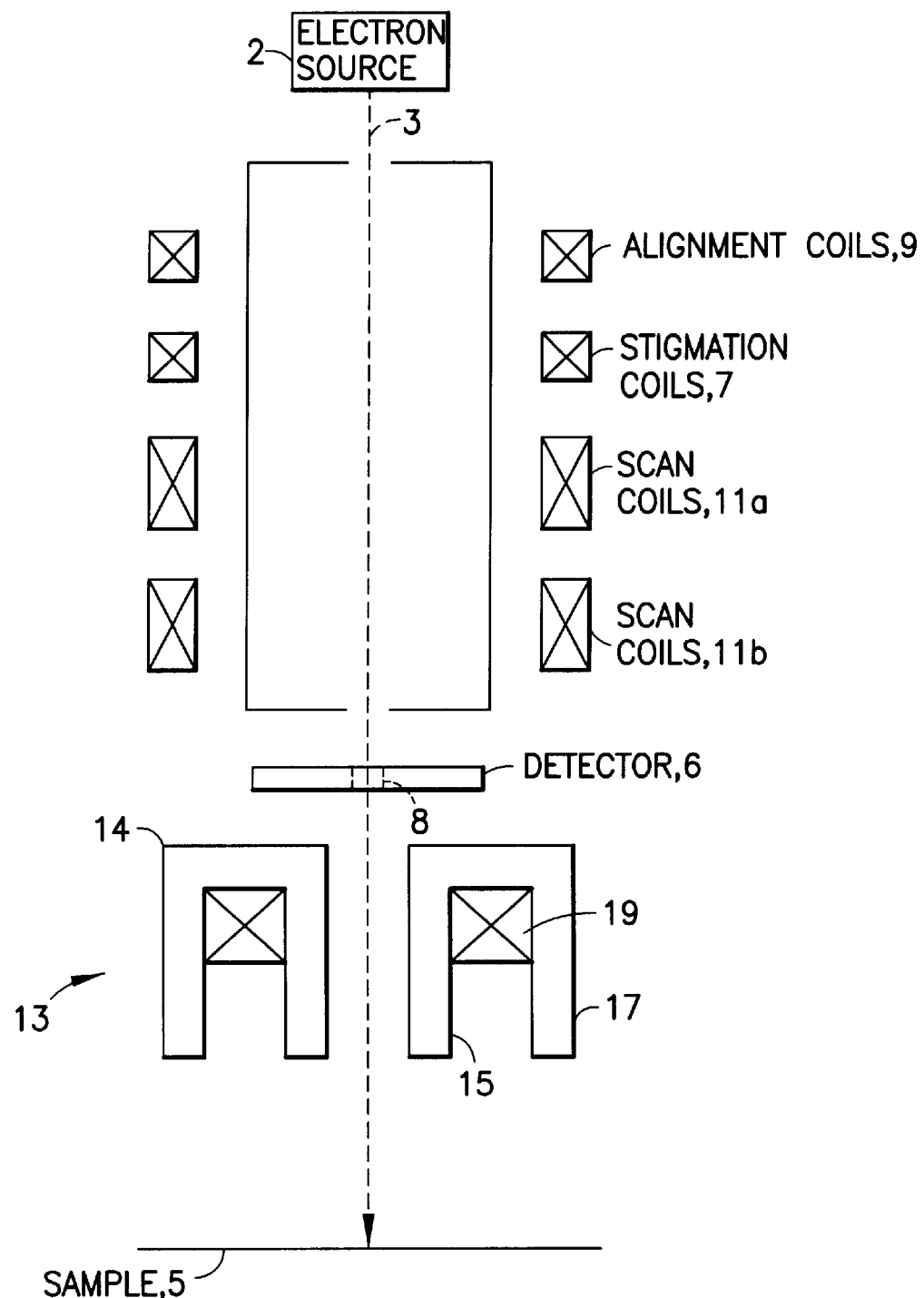
FIG. 1 is a cross-section of a prior art SEM.
Figure 2:
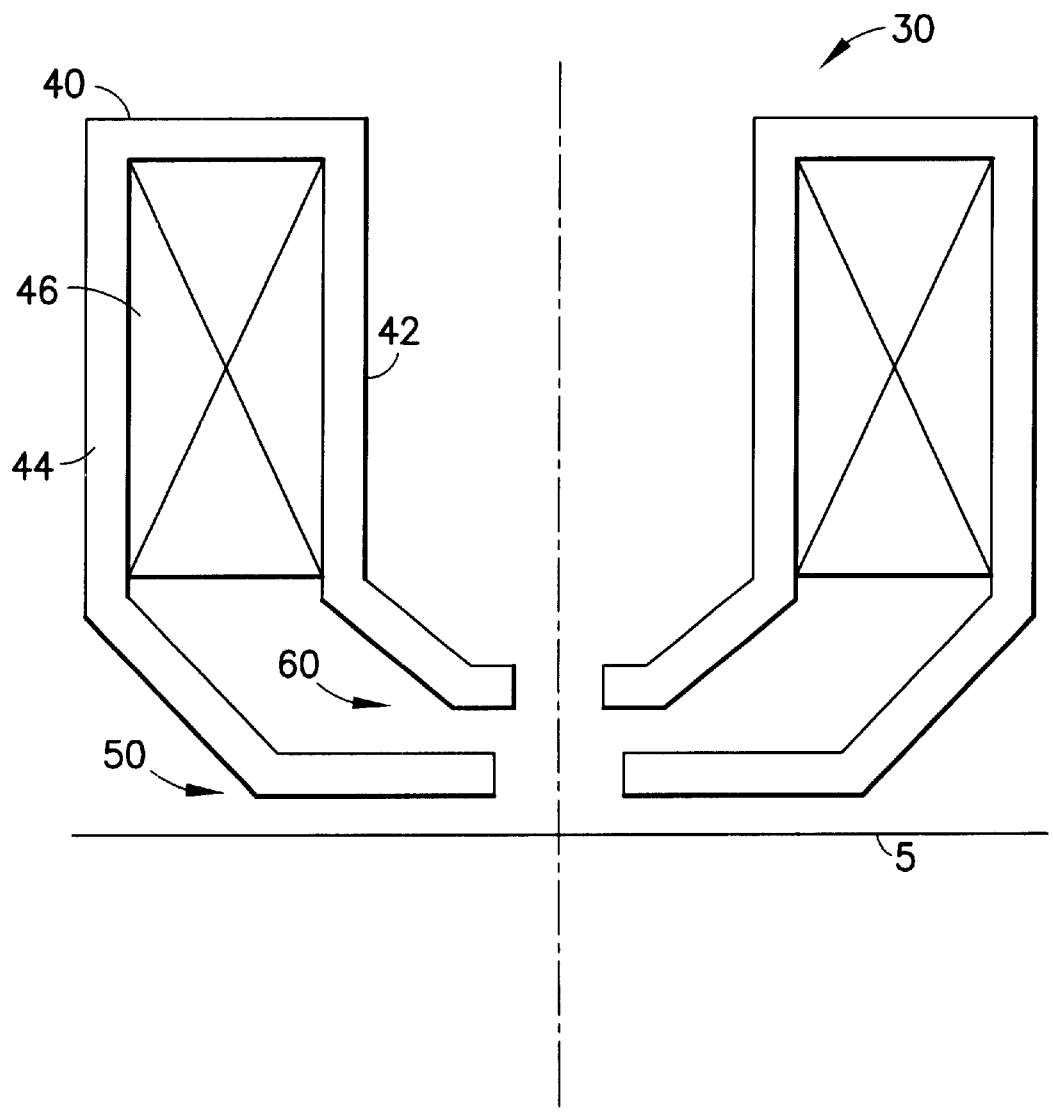
FIG. 2 shows a cross-section of a prior art objective lens for an SEM.
Figure 3:
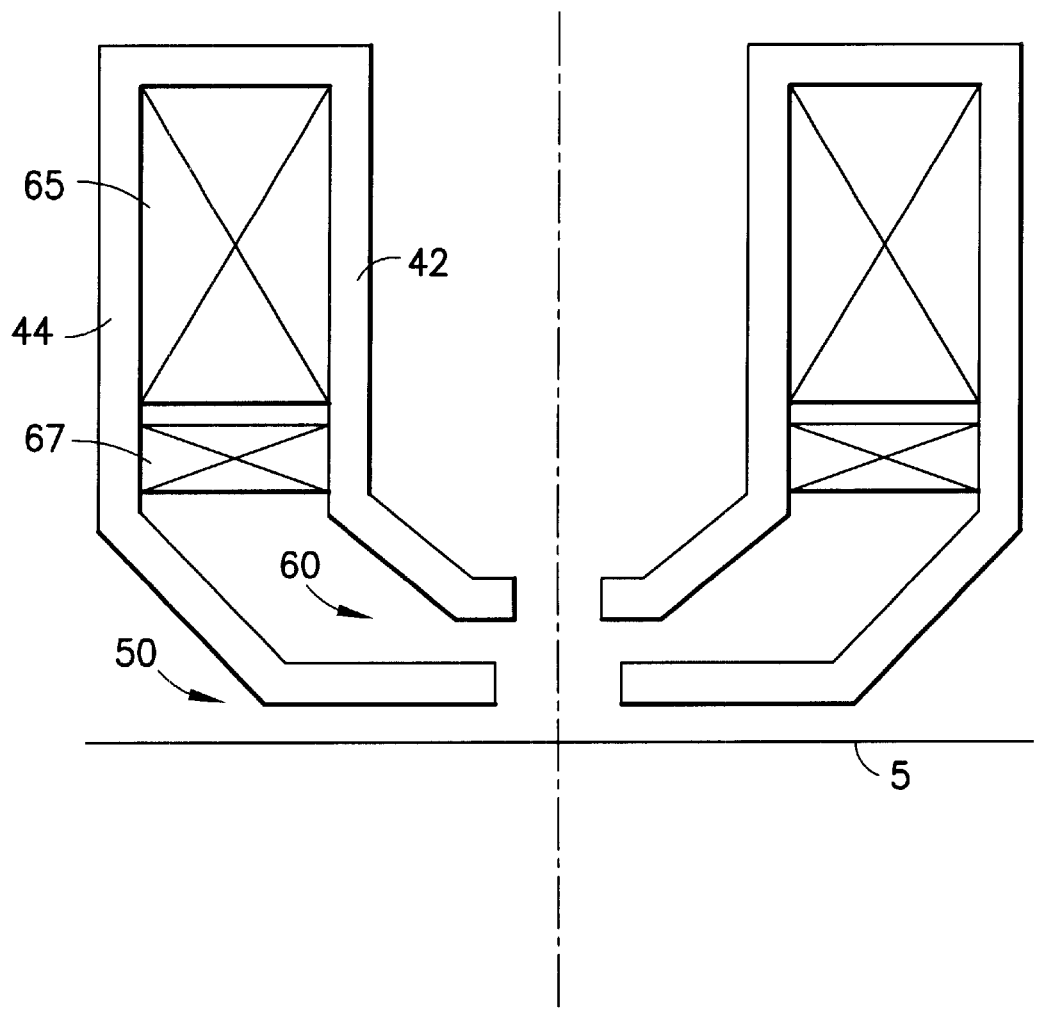
FIG. 3 shows an objective lens for an SEM with a winding arrangement in accordance with the present invention.

FIG. 3 shows that, in accordance with the present invention, winding 46 of FIG. 2 has been split into a primary winding 65 and a secondary winding 67. The combined effect of windings 65 and 67 in terms of creating the required magnetic flux at poles 50 and 60 is the same as the effect of the single winding 46. Thus, the effectiveness of objective lens 30 for focusing the electron beam 3 is unaffected. However, as explained below, various advantages are created with the winding arrangement of the present invention.

Figure 4:
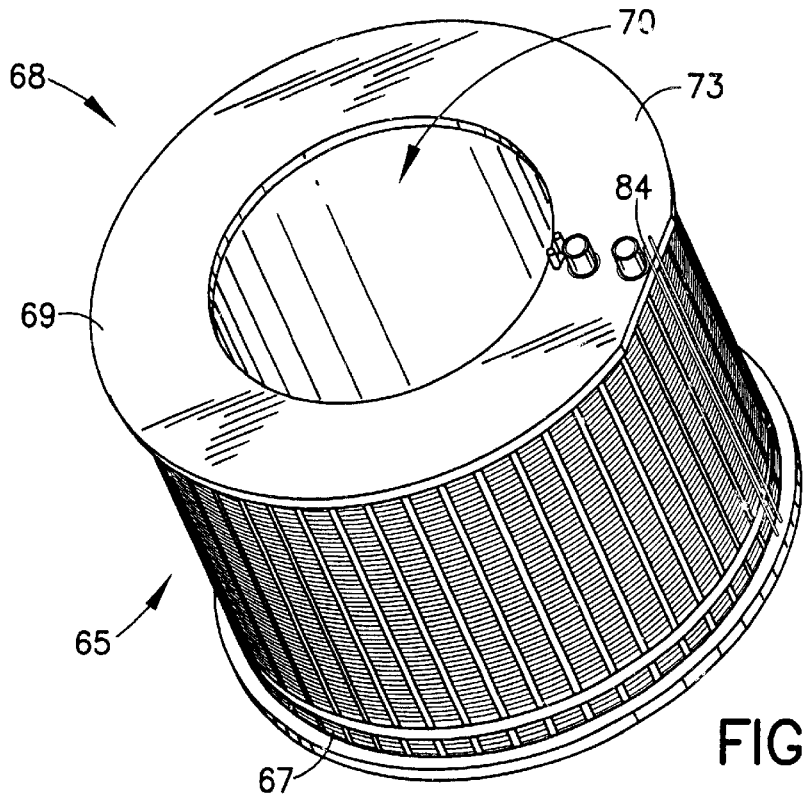
FIG. 4 shows a perspective view of a winding coil arranged in accordance with the present invention.
Figure 5:
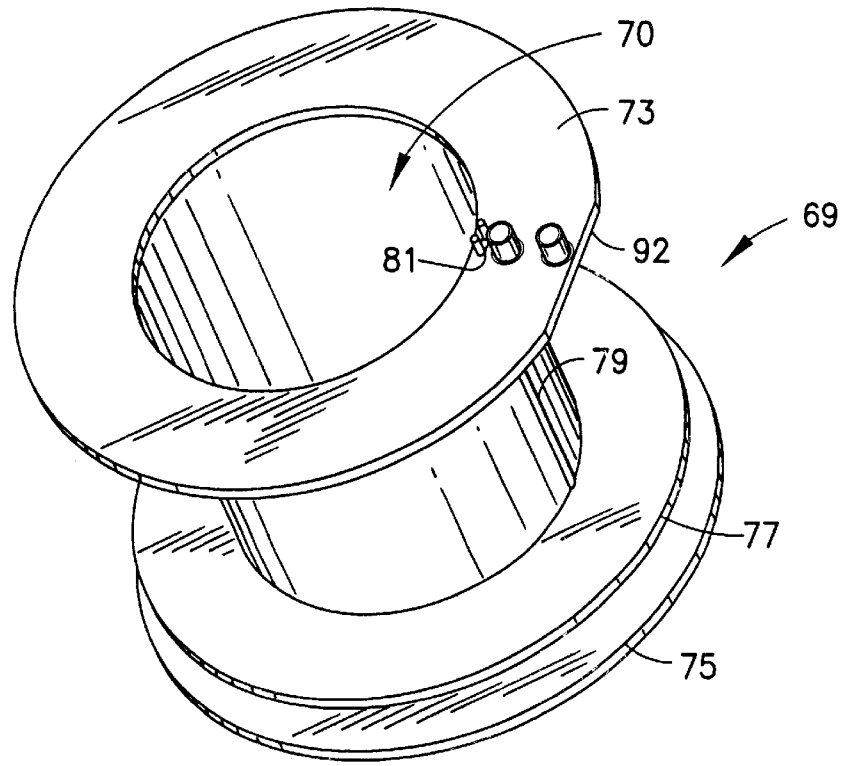
FIG. 5 shows a perspective view of a bobbin for the winding coil shown in FIG. 4.
Figure 6:
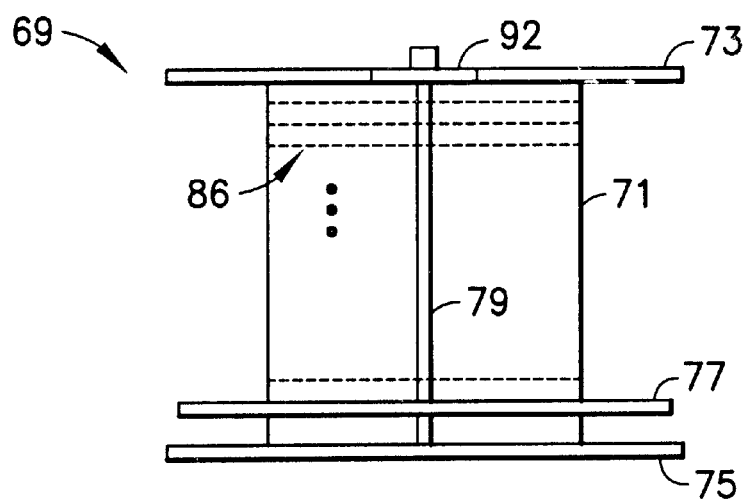
FIG. 6 shows an elevational view of the bobbin in FIG. 5.

FIG. 4 shows a coil winding 68 having windings 65 and 67 wound on bobbin arrangement 69. The bobbin arrangement can be a single bobbin on which both windings 65 and 67 are wound, or a separate bobbin can be provided for each winding. For ease of description, both approaches are referred to herein simply by the term "bobbin". Details of bobbin 69 are apparent from FIGS. 5 and 6. It has a central hole 70 through spool 71, an upper flange 73, a lower flange 75, and an intermediate flange 77. Bobbin 69 is formed of anodized aluminum. The primary winding 65 is wound between flanges 73 and 77, and the secondary winding 67 is wound between flanges 77 and 75. The spacing between flanges 73 and 77 is significantly bigger than that between flanges 77 and 75 because there is a substantially higher number of primary windings than secondary windings, as explained below.

Bobbin 69 is provided with a notch 79 that extends from an opening 81 in flange 73 to the space between flanges 77 and 75. To wind coils 65 and 67 on the bobbin, the secondary coil is started by leading a start wire 82 from the space between flanges 75 and 77, through notch 79 and up through opening 81. Secondary winding 67 is then wound to have twenty five layers 85 (see FIG. 7). Each of the layers has nine turns 86 (see FIG. 6), in the clockwise direction as viewed in FIG. 7, in the space between flanges 75 and 77. The end wire 84 of secondary winding 67 is placed on the outside of the primary winding 65 after its winding has been completed.

Figure 7:
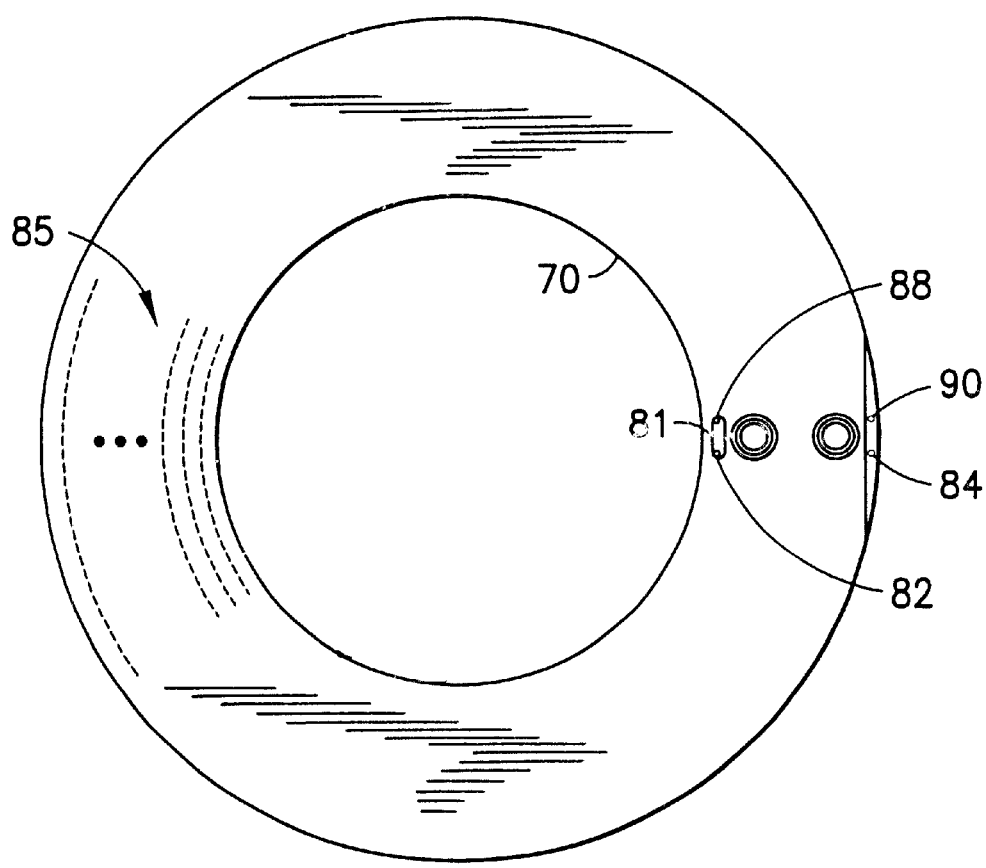
FIG. 7 shows a top view of the winding coil in FIG. 4.

Start wire 88 of primary coil 65 is also placed through opening 81, and then twenty five layers of eighty nine turns each are wound, in the clockwise direction as viewed in FIG. 7, in the space between flanges 73 and 75. End wire 90 of the primary coil is run along its outer periphery adjacent end wire 84 of the secondary coil so that they both terminate at a flat 92 on flange 73. Pins 92 and 94 are attached to the upper surface of flange 73 and are used for making terminal connections to the ends of wires 82, 84, 88 and 90. The details of such terminal connections are not deemed necessary since they are readily apparent to one with ordinary skill in the art.

The bobbin is sized to fit within the channel of polepiece 40, and is secured in position in a manner readily apparent to anyone with ordinary skill in the art.

The ratio between the number of turns of the two windings 65 and 67 is 89 to 9, or approximately 10 to 1. Another way of expressing the same thing is that the number of turns for the secondary winding 67 is 10% of the number of turns for the primary winding 65, when both windings have the same number of layers. This percentage can be in the range of 1% to 20% in order to provide valuable benefits in terms of adjustment speed and resolution.

The above-described winding configuration arranged in accordance with the invention has several beneficial results. Firstly, it enables faster adjustment of the magnetic lens because the adjustment is carried out by varying only the current through the secondary winding. The time constant of the secondary winding is considerably smaller than that of the primary winding. Secondly, the current adjustment is controlled by a digital controller. As such, it has a finite number of discrete settings. For the sake of illustration, the number of discrete settings is 100. If the magnetic flux is created by winding 19 of the prior art is 1000 Gauss, and the secondary winding of the present invention creates a magnetic flux of 100 Gauss (it has 10% of the ampere turns of winding 19), then the resolution per setting with the large winding 19 of the prior art is 10 Gauss/setting, whereas the resolution per setting with the secondary winding 67 of the present invention is 1 Gauss/setting.

Although a preferred embodiment of the present invention has been described in detail above, various modifications thereto will be readily apparent to anyone with ordinary skill in the art. It is to be understood that a key aspect of the invention is to provide two windings on the bobbin which have substantially different ampere-turns. A variety of ways are known to vary the ampere-turns. One particular way has been described above, namely using the same number of winding layers but a different number of winding rows. However, this result can also be achieved by varying the number of winding layers. In addition, the current passed through the windings can be different. Of course, a combination of the three can also be used. Another type of possible modification involves how the windings are positioned relative to each other. The description provided above places the primary winding axially above the secondary winding on the spool. However, this can just as well be reversed. Also, one of the windings can be wound radially outside of the other one. A further type of possible modification involves the applicability of this invention to lenses other than objective lenses. The invention can be applied to any magnetic lens that has a large time constant which impedes the speed of adjustment. These and all other such variations are intended to fall within the scope of the present invention as defined by the following claims.

I claim:

1. A winding coil for a magnetic lens which controls a charged particle beam, comprising:

a bobbin arrangement;

a primary winding wound on said bobbin arrangement and having a selected number of ampere-turns; and a secondary winding wound on said bobbin arrangement and having a selected number of ampere-turns;

wherein the number of ampere-turns of said secondary winding is substantially smaller than the number of ampere-turns of said primary winding.

2. The magnetic lens of claim 1, wherein the number of ampere-turns of said secondary winding is in the range of 1% to 20% of the number of ampere-turns of said primary winding.

3. The magnetic lens of claim 2, wherein the number of ampere-turns of said secondary winding is in the range of 5% to 10% of the number of ampere-turns of said primary winding.

4. The magnetic lens of claim 1, wherein said bobbin arrangement includes a spool, and said primary and secondary windings are wound on different axial portions of said spool and are spaced from each other.

5. The magnetic lens of claim 4, wherein said bobbin arrangement includes a first flange extending from said spool and interposed between said primary and secondary windings.

6. The magnetic lens of claim 5, wherein said bobbin arrangement includes a second flange extending from said spool, and wherein said primary winding is located between said first and second flanges.

7. The magnetic lens of claim 6, wherein said bobbin arrangement includes a third flange extending from said spool, and wherein said secondary winding is located between said second and third flanges.

* * * * *